United States Patent
Chang et al.

(10) Patent No.: US 8,080,838 B2
(45) Date of Patent: Dec. 20, 2011

(54) CONTACT SCHEME FOR FINFET STRUCTURES WITH MULTIPLE FINS

(75) Inventors: Leland Chang, New York, NY (US); Wilfried E. Haensch, Somers, NY (US); Meikei Ieong, Wappingers Falls, NY (US); Ghavam Shahidi, Pound Ridge, NY (US); Huiling Shang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 12/434,233

(22) Filed: May 1, 2009

(65) Prior Publication Data

US 2009/0212366 A1 Aug. 27, 2009

Related U.S. Application Data

(62) Division of application No. 11/448,702, filed on Jun. 7, 2006, now abandoned.

(51) Int. Cl.
*H01L 27/088* (2006.01)
(52) U.S. Cl. .... 257/288; 257/368; 257/401; 257/E27.06
(58) Field of Classification Search ................. 257/347, 257/368, 401, 288, E27.06, E27.112
See application file for complete search history.

(56) References Cited

U.S. PATENT DOCUMENTS

| | | | |
|---|---|---|---|
| 2005/0202618 A1* | 9/2005 | Yagishita | 438/197 |
| 2005/0242395 A1* | 11/2005 | Chen et al. | 257/347 |
| 2005/0285161 A1* | 12/2005 | Kang et al. | 257/288 |
| 2005/0285186 A1* | 12/2005 | Fujiwara | 257/327 |
| 2007/0026629 A1 | 2/2007 | Chen et al. | |
| 2007/0161170 A1* | 7/2007 | Orlowski et al. | 438/197 |

OTHER PUBLICATIONS

Choi, J. A. et al., "Large Scale Integration and Consideration of Triple Gate Transistors." IEDM, 2004, p. 647.

* cited by examiner

*Primary Examiner* — Victor A Mandala
*Assistant Examiner* — Scott Stowe
(74) *Attorney, Agent, or Firm* — Scully, Scott, Murphy & Presser, P.C.; Vazken Alexanian

(57) ABSTRACT

A FINFET-containing structure having multiple FINs that are merged together without source/drain contact pads or a local interconnect is provided. The structure includes a plurality of semiconducting bodies (i.e., FINs) which extend above a surface of a substrate. A common patterned gate stack surrounds the plurality of semiconducting bodies and a nitride-containing spacer is located on sidewalls of the common patterned gate stack. An epitaxial semiconductor layer is used to merge each of the semiconducting bodies together.

18 Claims, 17 Drawing Sheets

CONTACT SCHEME FOR FINFET STRUCTURES WITH MULTIPLE FINS

RELATED APPLICATION

This application is a divisional of U.S. patent application Ser. No. 11/448,702, filed Jun. 7, 2006.

FIELD OF THE INVENTION

The present invention relates to a semiconductor structure and a method of fabricating the same. More particularly, the present invention relates to a FINFET-containing structure having multiple FINs that are merged together without source/drain contact pads or local interconnects. The present invention also relates to a method for fabricating a FINFET-containing structure having multiple FINs that are merged together. The inventive method is suitable for actual FINFET technology and greatly improves the layout efficiency of multiple FINFETs.

BACKGROUND OF THE INVENTION

Double gated and tri-gated transistors have higher scalability than single gated FETs since the multiple gates help to control the potential in the body. Among the several double gated and tri-gated device architectures, the FINFET has been considered as one of the most promising candidates for 32 nm node technology and beyond because it combines the critical elements of superior scalability found in all multi gated devices with the manufacturability of conventional transistors.

The body of a FINFET device having a double gate or a tri-gate consists of a thin (on the order of about 10 nm) vertical crystalline semiconducting wall called a FIN which typically extends from a surface of an underlying substrate. In double gated FINFETs, gate material warps around both sides of the FIN creating a channel on each side thereof. For a tri-gate FINFET device, the gate material is located atop the FIN as well as around both sides of the FIN creating a channel on each side of the FIN as well as atop the FIN.

The main advantages of a FINFET structure over other multi-gated device designs is that the self-aligned gates can be fabricated using a single lithographic and etching step.

In a conventional FINFET gate design layout such as shown in FIG. 1B, large source/drain landing (i.e., contact pads) 12 are used to connect an array of narrow FINS 14 in parallel at two ends. In FIG. 1B, reference numeral 10 denotes the active area, while reference numeral 16 denotes the gate. For comparison, FIG. 1A shows a conventional design layout for a planar FET.

For FIG. 1A, the planar FET ground rule is equal to the contact-gate overlay which is the distance $d_1$ between the source/drain contact pads 12 and the gates 16. In FIG. 1B, the FINFET ground rule is equal to the contact-gate overlay plus the contact-active overlay. The ground rule for the FINFET structure is thus represented by the distance $d_2$. The particular design layout shown in FIG. 1B is, however, unsuitable for actual FINFET technology since the use of source/drain landing pads inevitably increases the gate contact pitch due to overlay requirements.

Moreover, and in a conventional FINFET design layout, the minimum spacing from the source/drain contact to the gate is the contact-to-gate overlay plus the contact-to-active overlay. This is undesirable since the layout efficiency of a FINFET is severely degraded over that of a conventional planar FET. Furthermore, the use of source/drain landing pads also complicates spacer etching of the small space between the FINFET gate and the landing pad.

In 32 nm node technology and beyond, the minimum pitch required for active layers will be reduced to approximately 120 nm or less. When such a small pitch is used, the source/drain contact formation becomes a serious challenge due to gate-to-active overlay requirements and the need for raised source/drain regions for series resistance reduction.

Elimination of source/drain landing pads simultaneously solves both of the above mentioned problems, but requires that parallel FINS be strapped together. One reported idea, which is described by J. A. Choi et al., IEDM, 2004, p. 647, is to strap the FINs together by local interconnects. This particular scheme is shown, for example, in FIG. 2. One problem with the scheme described by J. A. Choi et al. is that the addition of local interconnects significantly increases the parasitic capacitance, thus degrading the overall circuit performance.

In view of the above, there is a need for providing an alternative contact scheme for FINFET structures that include multiple FINs.

SUMMARY OF THE INVENTION

The present invention provides an alternative contact scheme for FINFET structures including multiple FINs. In particular, the present invention provides an alternative contact scheme in which each individual FIN within the structure is merged together by selective epitaxy. The selective epitaxy provides epitaxially (i.e., epi) grown semiconductor material that straps (i.e., merges) the individual FINs together without the need of large contact pads or local interconnects, as is typically the case with prior art FINFET structures. The inventive "FIN only" array design makes it easier to adopt new advanced lithographic methods.

Compared with the local interconnect approach mentioned above, the inventive approach described herein, i.e., the merged FIN approach, provides lower parasitic capacitance and does not require any additional processing steps.

In general terms, the present invention thus provides a FINFET structure including:

a plurality of parallel oriented semiconducting bodies (i.e., FINs) which extend above a surface of a substrate;

a common patterned gate electrode surrounding the plurality of parallel oriented semiconducting bodies;

an insulating layer located on exposed sidewall surfaces and on a top surface of the common patterned gate electrode;

a nitride-containing spacer located only on a lower portion of said insulating layer that is located on the sidewall surfaces of the common patterned gate electrode in a region in which the common patterned gate electrode intercrosses with at least one of the parallel oriented semiconducting bodies; and an epitaxial semiconductor layer located atop and between each of said parallel oriented semiconductor bodies, said epitaxial semiconductor layer merges each of the parallel oriented semiconducting bodies together.

In addition to the above structure, the present invention also contemplates a method of fabricating the same. The inventive method includes the steps of:

providing a plurality of parallel oriented semiconducting bodies (i.e., FINs) which extend above a surface of a substrate;

forming a common patterned gate electrode surrounding said plurality of parallel oriented semiconducting bodies;

forming a nitride-containing spacer on a sidewall of said common patterned gate electrode in a region in which said common patterned gate electrode intercrosses with at least one of said parallel oriented semiconducting bodies; and epitaxially growing an epitaxial semiconductor layer that merges each of said parallel oriented semiconducting bodies together.

BRIEF DESCRIPTION OF THE DRAWINGS

FIG. 1A is a diagram showing the design layout of a prior art planar MOSFET, where the minimum source/drain contact to gate spacing is determined by the gate-to-contact overlayer, while

DETAILED DESCRIPTION OF THE INVENTION

The present invention, which provides a FINFET structure with multiple FINs that are merged together by an epitaxially grown semiconductor material and a method of fabricating such a FINFET structure, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
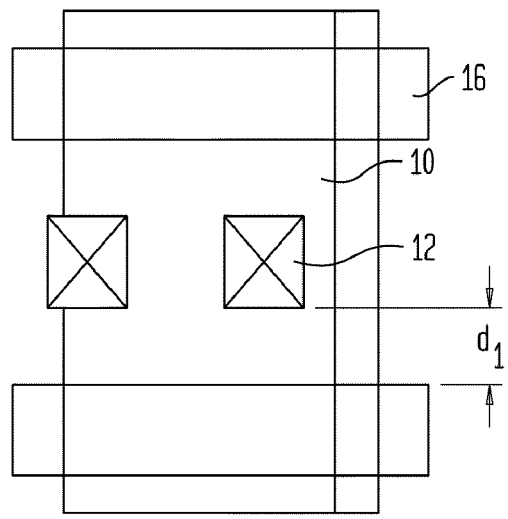
Figure 1B:
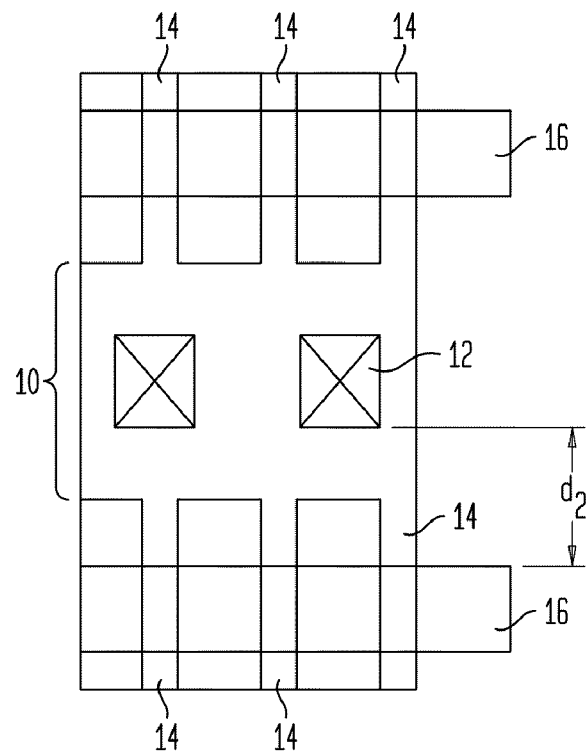
FIG. 1B is a diagram showing the design layout for a prior art FINFET with source/drain landing pads, where the minimum source/drain contact-to-gate spacing is limited by the contact-to-active overlay in addition to the contact-to-gate overlay.
Figure 2:
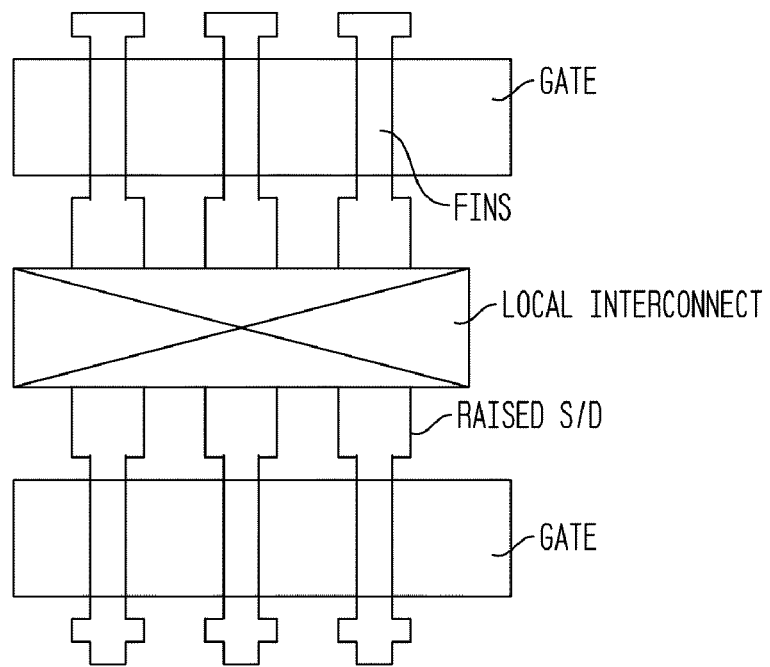
FIG. 2 is a diagram of a prior art FINFET structure including multiple FINs that are strapped together with a local interconnect.
Figure 3:
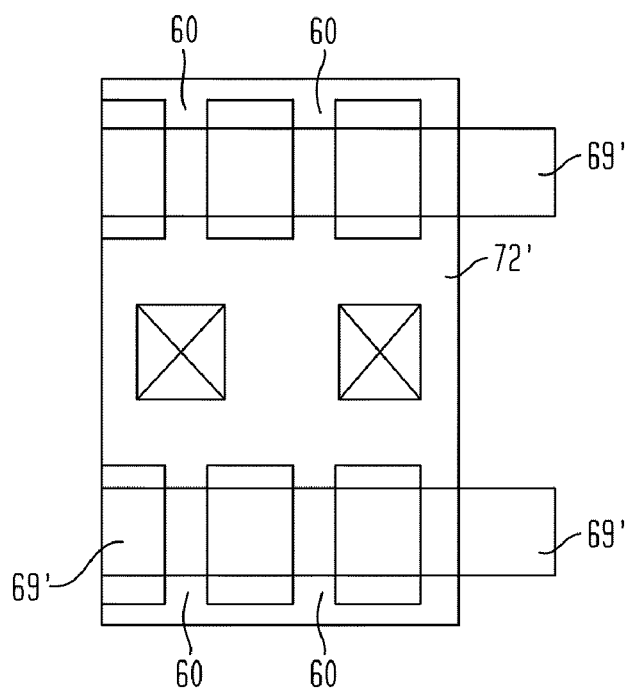
FIG. 3 is a diagram of the inventive FINFET structure including multiple FINs that merged (i.e., strapped) together by selective epitaxial growth of a semiconductor material.

As stated above, the present invention provides a new contact design layout for a FINFET having multiple parallel oriented FINs in which the parallel oriented FINs are merged together without utilizing source/drain contact pads or local interconnects, as is shown, for example, in FIGS. 1B and 2. Instead, the multiple parallel oriented FINs of the FINFET structure of the present application are merged (i.e., strapped) together with an epitaxially grown semiconductor material. The inventive contact scheme is illustrated in FIG. 3. Specifically, FIG. 3 is a diagram showing the inventive FINFET contact scheme in which the multiple parallel oriented FINs are merged together with a selectively grown epitaxial semiconductor material. In FIG. 3, reference numeral 72' represents the epitaxially grown semiconductor material, reference numeral 60 denotes the parallel oriented FINs and reference numeral 69' denotes the common patterned gate electrode. The design layout shown in FIG. 3 provides lower parasitic capacitance than prior art approaches and thus, it represents an advancement in the art.

Figure 4:
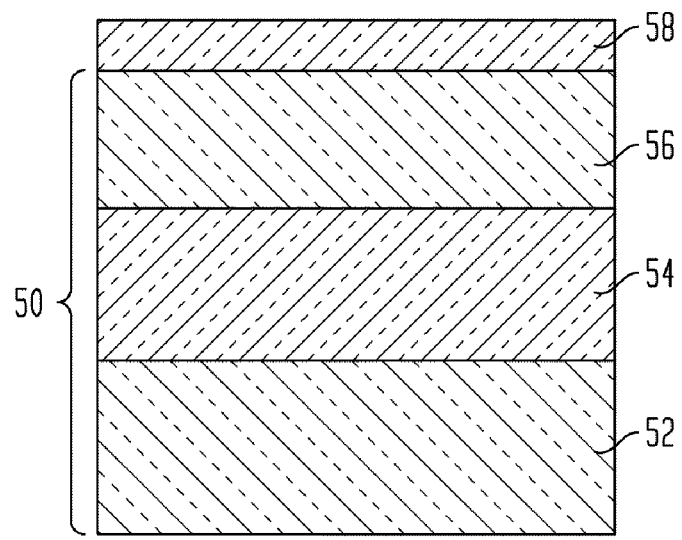
FIGS. 4-12 are pictorial representations illustrating the basic processing steps of the present application. In some of these drawings, various views including cross sectional and top-down prospective views are shown. In some embodiments, a view through line A-A' is shown, while in other a view through line B-B' is shown. The line A-A' is a line that runs perpendicular to the FINs, while line B-B' is a line running parallel through one of the FINs.

Reference is now made to FIGS. 4-12 which illustrate the basic processing steps that are utilized in the present invention to provide the contact scheme shown in FIG. 3. FIG. 4 illustrates a semiconductor-on-insulator (SOI) substrate 50 after forming a hard mask 58 on an upper surface of the SOI substrate 50.

The SOI substrate 50 includes a buried insulating region 54 that is positioned between a bottom semiconductor layer 52 and a top semiconductor layer 56. The top semiconductor layer 56 is sometimes referred to in the art as an SOI layer of an SOI substrate.

The term "semiconductor" as used herein to describe the bottom semiconductor layer 52 and the top semiconductor layer 56 denotes any semiconducting material including, for example, Si, Ge, SiGe, SiC, SiGeC, InAs, GaAs, InP or other like III/V compound semiconductors. Multilayers of these semiconductors are also contemplated herein. In a preferred embodiment, both semiconductor layers, i.e., the bottom semiconductor layer 52 and the top semiconductor layer 56 of the SOI substrate 50 are both comprised of Si.

The buried insulating layer 54 may be a crystalline or non-crystalline oxide or nitride. In a preferred embodiment of the present invention, the buried insulating layer 54 is an oxide. The buried insulating layer 54 may be continuous, as shown, or it may be discontinuous. When a discontinuous buried insulating region is present, the insulating region exists as isolated islands that are surrounded by semiconductor material.

The SOI substrate 50 may be a standard (100) oriented wafer, a (110) oriented wafer, or any other surface orientation. Hybrid SOI substrates having surface regions of different crystallographic orientations are also contemplated.

The SOI substrate 50 may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the top semiconductor layer to a layer having a thickness that is more desirable.

The thickness of the top semiconductor layer 56 of the SOI substrate 50 is from about 100 to about 1000 Å, with a thickness from about 500 to about 700 Å being more highly preferred. If the thickness of the top semiconductor layer 56 is not within the above mentioned range, a thinning step such as, for example, planarization or etching may be used to reduce the thickness of the top semiconductor layer 56 to a value within the range mentioned above. The thinning step is performed prior to forming the hard mask 58 on a surface of top semiconductor layer 56.

The buried insulating layer 54 of the SOI substrate 50 has a thickness from about 10 to about 2000 Å, with a thickness from about 1000 to about 1500 Å being more highly preferred. The thickness of the bottom semiconductor layer 52 of the SOI substrate 50 is inconsequential to the present invention.

The hard mask 58 is then formed on a surface of the top semiconductor layer 56 of the SOI substrate 50 utilizing a conventional deposition process such as, for example, chemical vapor deposition (CVD), plasma enhanced chemical vapor deposition (PECVD), chemical solution deposition, evaporation or other like deposition processes. Alternatively, the hard mask 58 may be formed by a thermal process such as, for example, oxidation or nitridation. Any combination of the above mentioned processes can also be used in forming the hard mask 58.

The hard mask 58 comprises an oxide, nitride, oxynitride or any combination thereof including multilayers. In one embodiment of the present invention, the hard mask 58 is an oxide including, for example, silicon oxide or silicon nitride. The thickness of the hard mask 58 may vary depending on the technique used in forming the same, the material of the hard mask itself, and the number of layers within the hard mask layer. Typically, the hard mask 58 has a thickness from about 200 to about 800 Å, with a thickness from about 400 to about 600 Å being more typical. It is noted that the hard mask 58 is utilized in the present invention during a subsequent etching of the top semiconductor layer 56 to define the active regions as well as to protect the subsequently formed FIN during a gate etch and also during a spacer etch.

Figure 5A:
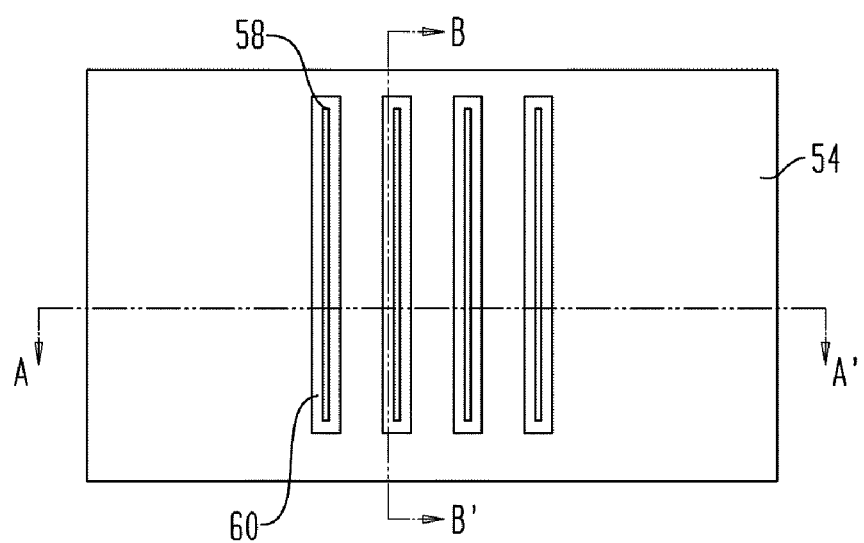
Figure 5B:
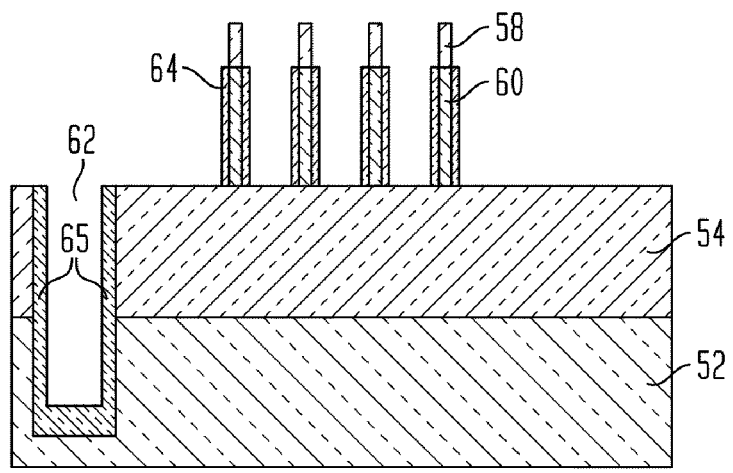
Figure 5C:
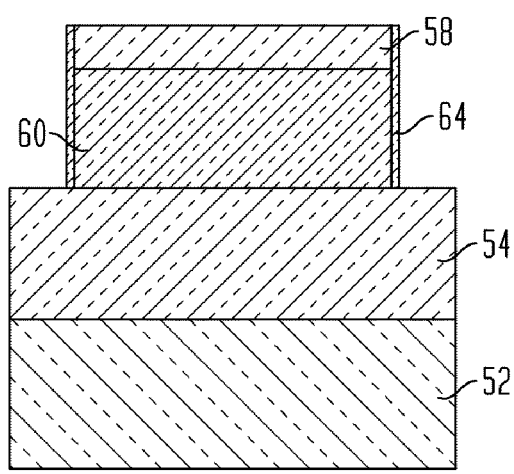

FIGS. 5A-5C shows the structure of FIG. 4 after formation of a plurality of parallel oriented semiconducting bodies 60. It is noted that each of the parallel oriented semiconducting bodies 60 thus formed have a narrow width on the order of about 20 nm or less and, a vertical thickness that is within the range provided above as such, they are referred hereinafter as FINs.

Each of the parallel oriented FINs 60 shown in FIGS. 5A-5C is formed by lithography and etching. The lithographic step includes applying a photoresist (not shown) atop the hard mask 58, exposing the photoresist to a desired pattern of radiation, and developing the exposed resist utilizing a conventional resist developer. The etching process comprises drying etching and/or wet chemical etching. Illustrative examples of suitable dry etching processes that can be used in the present invention include reactive ion etching, ion beam etching, plasma etching or laser ablation. Typically, a reactive ion etching process or an ion beam etching process is used. The etching process first transfers the pattern from the patterned photoresist to the hard mask 58 and thereafter to the underlying top semiconductor layer 56. The patterned photoresist is typically, but not necessarily always, removed after the pattern has been transferred to the hard mask 58. A conventional resist stripping process is used to remove the patterned photoresist from the structure.

In some embodiments of the present invention, a trench opening 62 is formed into an exposed portion of the buried insulating layer 54 that extends down into the semiconductor substrate 52 prior to forming the FINS 60. The trench opening 62 is formed by lithography and etching and is used for alignment purposes. The trench opening 62 is typically lined with a dielectric material 65 such as an oxide. The dielectric material 65 is formed by conventional techniques well known to those skilled in the art. The structure including the trench opening 62 and dielectric material 65 is also shown in FIG. 5B. It is noted that the use of this trench opening 62 is optional At this point of the present invention (See, FIGS. 5B-5C as well), a sacrificial oxide 64 is formed that lines the exposed sidewalls of each of the parallel oriented FINs 60. The sacrificial oxide 64 is formed by a deposition process such as, for example, CVD, PECVD, ALD, evaporation or chemical solution deposition. Alternatively, a thermal oxidation process can be used to form sacrificial oxide 64. The sacrificial oxide 64 is removed from the sidewalls of each FIN 60 prior to forming the gate stack utilizing a conventional stripping process.

In some embodiments of the present invention (not shown herein), the hard mask 58 can be removed atop each of the FINs 60 at this point of the present invention. This particular embodiment allows for the fabrication of a tri-gated device since the gate dielectric to be subsequently formed would be present on the sides and the top of each of the FINs 60.

Figure 6:
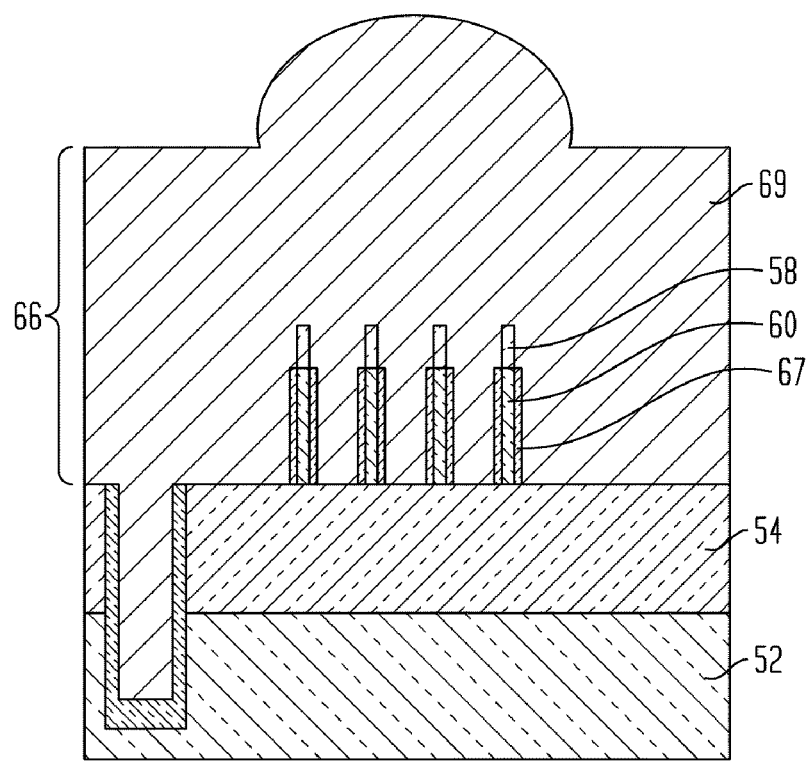

Next, a gate stack 66 is formed over the entire structure. The resultant structure including the gate stack 66 is shown, for example, in FIG. 6. It is noted that FIG. 6 is a view through line A-A' which runs perpendicular to the FINs 60.

The gate stack 66 comprises a gate dielectric 67 and a gate electrode 69. The gate dielectric 67 can be formed by a thermal growth process such as, for example, oxidation, nitridation or oxynitridation. Alternatively, the gate dielectric 67 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 67 may also be formed utilizing any combination of the above processes.

The gate dielectric 67 is comprised of an insulating material having a dielectric constant of about 4.0 or greater. All dielectric constants mentioned herein are relative to a vacuum unless otherwise noted. In one embodiment, the gate dielectric 67 comprises a high k material. The term "high k" denotes a dielectric having a dielectric constant of greater than 4.0, preferably greater than 7.0. Specifically, the gate dielectric 67 employed in the present invention includes, but is not limited to: an oxide, nitride, oxynitride and/or silicate including metal silicates and nitrided metal silicates. In one embodiment, it is preferred that the gate dielectric 67 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of gate dielectrics include $HfO_2$, hafnium silicate and hafnium silicon oxynitride. The physical thickness of the gate dielectric 67 may vary, but typically, the gate dielectric 67 has a thickness from about 0.5 to about 10 nm, with a thickness from about 0.5 to about 3 nm being more typical.

Next, a gate electrode 69 is formed. The gate electrode 69 is comprised of a conductive material, including, for example, polySi, SiGe, a metal, a metal alloy, a metal silicide, a metal nitride, a metal carbide or combinations including multilayers thereof. When multilayers are present, a diffusion barrier (not shown), such as TiN or TaN, can be positioned between each of the conductive layers.

The gate electrode 69 is formed utilizing a conventional deposition process including, for example, chemical vapor deposition, plasma enhanced chemical vapor deposition, atomic layer deposition, sputtering, plating, evaporation and any other like deposition processes. In embodiments in which poly Si or SiGe are used as the gate electrode 69, an in-situ deposition process can be used or alternatively deposition followed by ion implantation can be used. The thickness of the gate electrode 69 is not critically to the present invention. Typically, however, the thickness of the gate electrode 69 is from about 50 to about 200 nm.

Figure 7A:
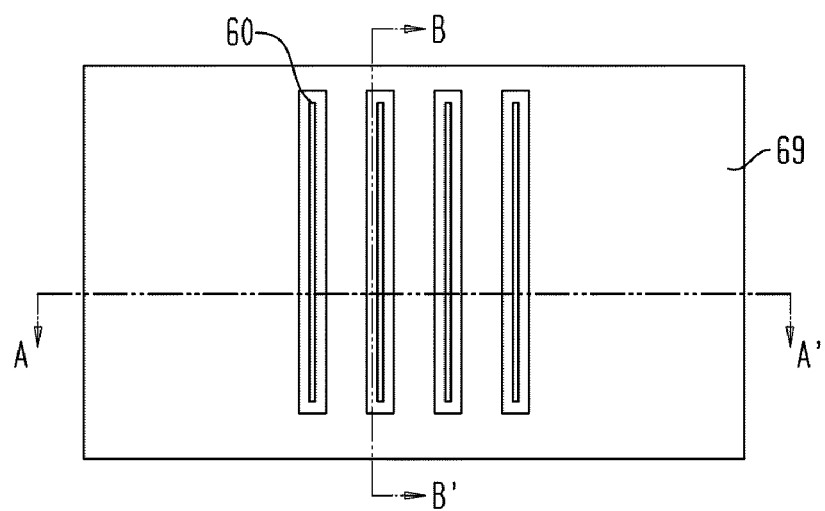
Figure 7B:
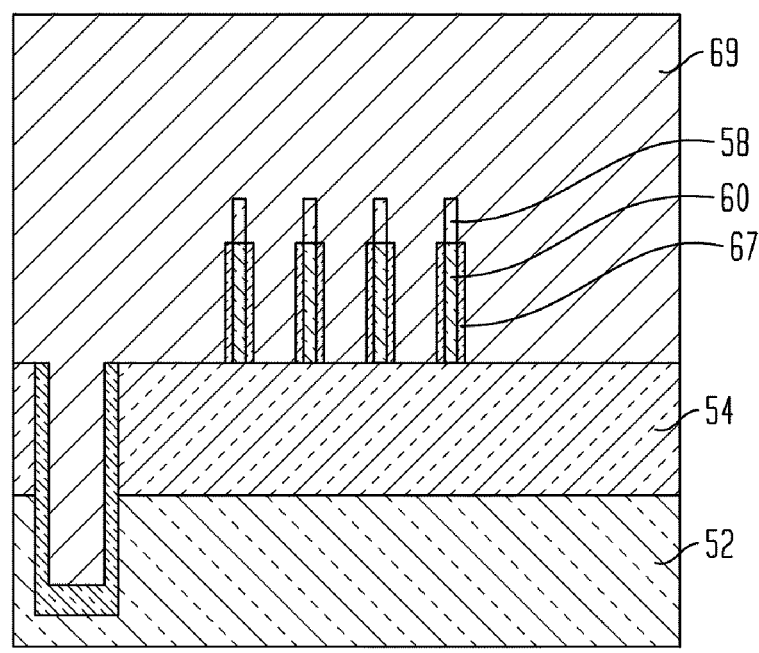
Figure 7C:
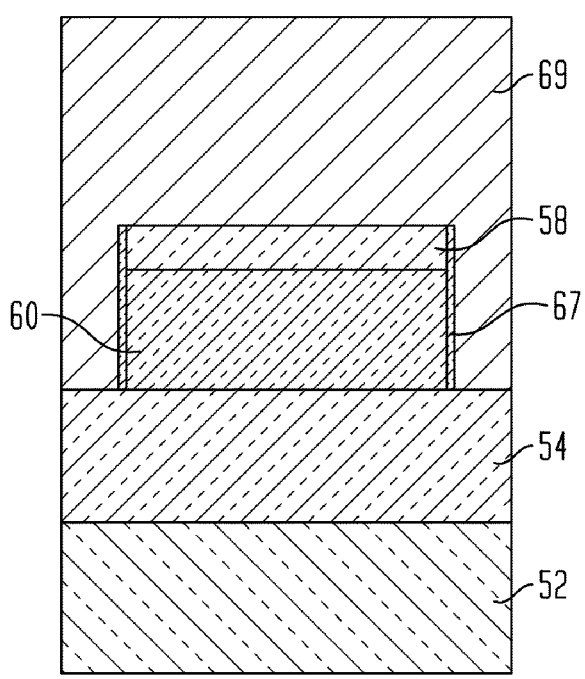

FIGS. 7A-7C show the structure of FIG. 6 after planarization which removes a portion of the gate electrode 69. The planarization process is performed utilizing a conventional planarization process such as, for example, chemical mechanical polishing (CMP) and/or grinding.

Figure 8A:
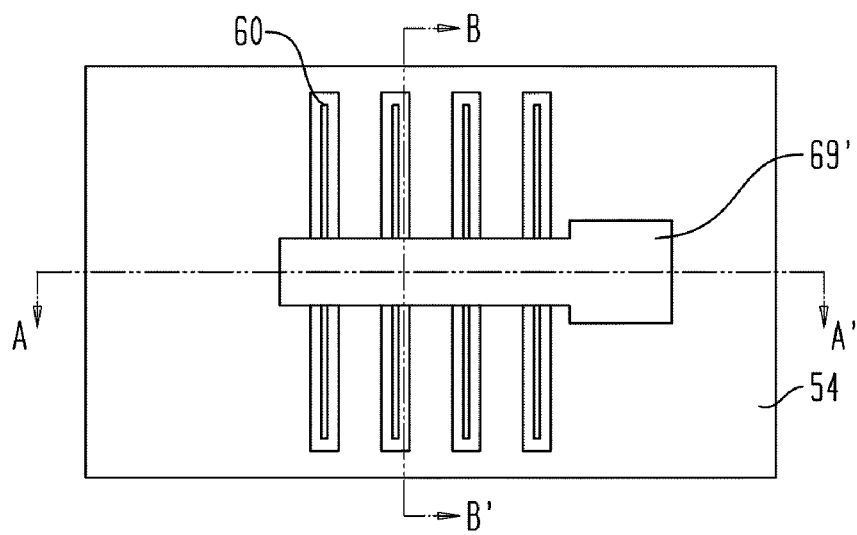
Figure 8B:
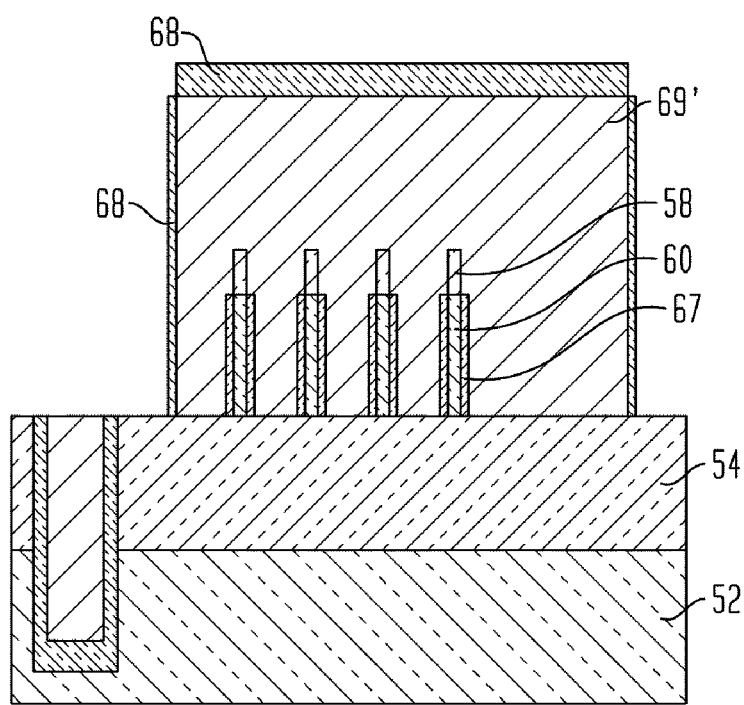
Figure 8C:
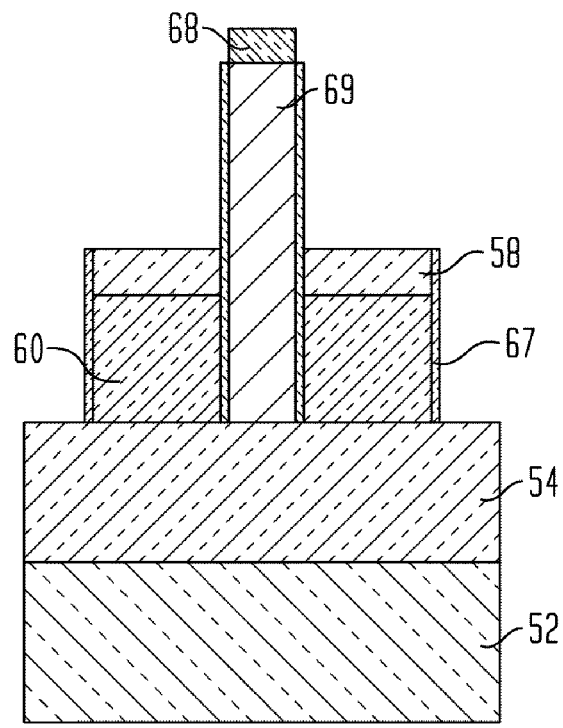

Next, the gate electrode 69 is patterned by lithography and etching providing the structure shown, for example, in FIGS. 8A-8C. In these drawings, the patterned gate electrode, which is common to each of the parallel oriented FINs 60, is denoted by reference numeral 69'. It is noted that the common patterned gate electrode 69' is oriented perpendicular to each of the parallel oriented FINs 60. The lithographic and etching processes employed in patterning the gate electrode 69 are the same as those mentioned above for patterning the FINs 60. After formation of the common patterned gate electrode 69', an insulating layer 68 (including an oxide, nitride, or multilayers thereof) is formed on all exposed surfaces of the patterned gate electrode 69'. The structure including the insulating layer 68 is also shown in FIGS. 8B-8C. The insulating layer 68 is formed utilizing a conventional deposition process or by a conventional thermal growth method.

Figure 9A:
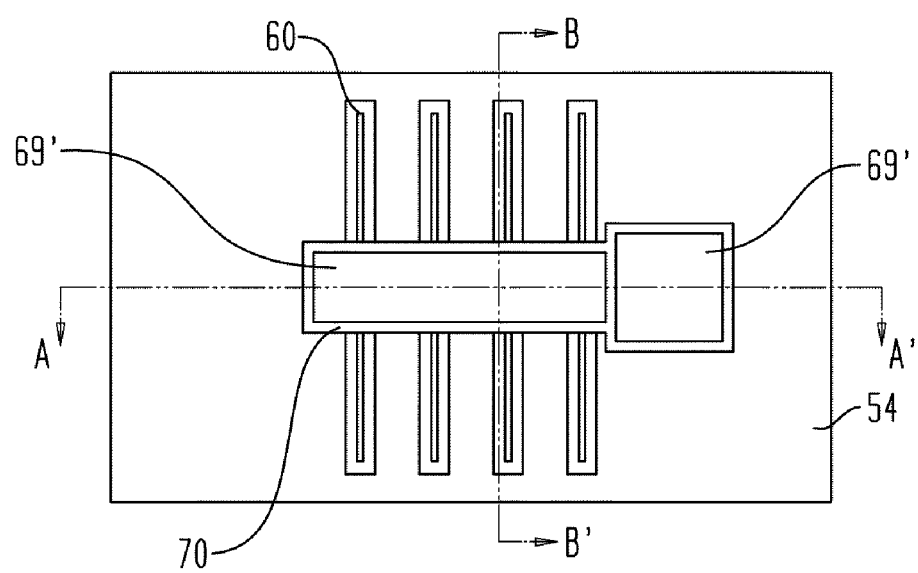
Figure 9B:
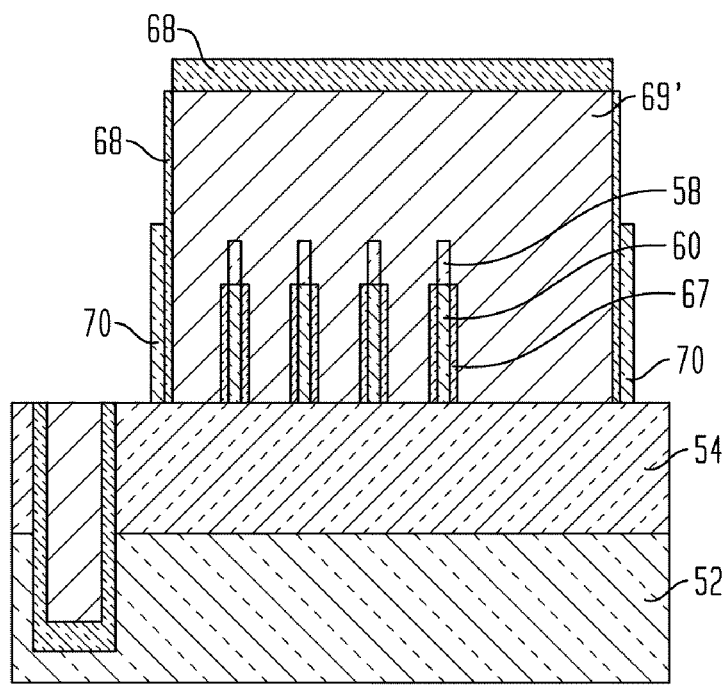
Figure 9C:
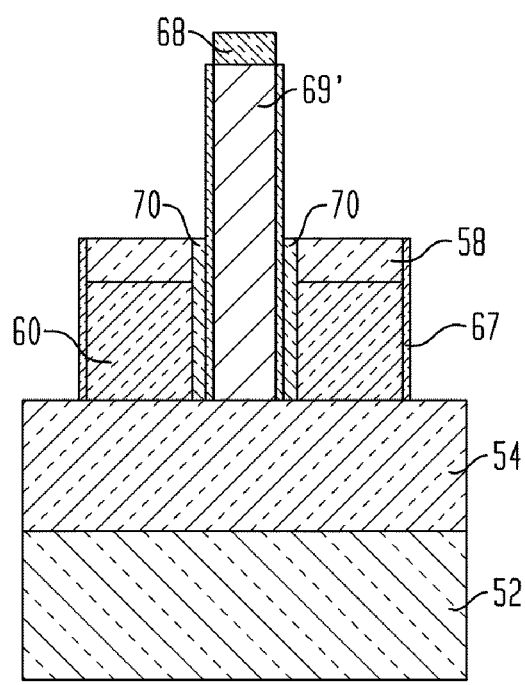

FIGS. 9A-9C show the structure of FIGS. 8A-8C after forming a nitride-containing spacer 70 on exposed sidewalls of the common patterned gate electrode 69' which includes the insulating layer 68. The nitride-containing spacer 70 is formed only in regions in which a FIN and a corresponding patterned gate conductor intercross. The nitride-containing spacer 70 is formed by deposition and etching. Typically, an aggressive over etch using a reactive ion process is employed in forming the nitride-containing spacer 70.

Figure 10A:
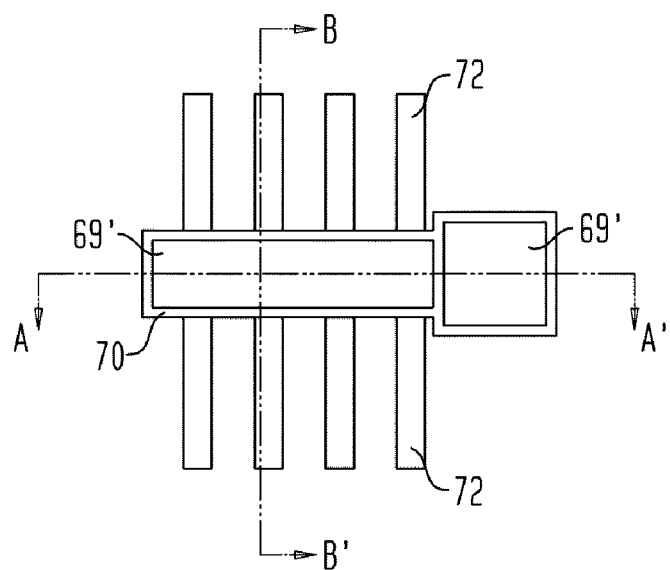
Figure 10B:
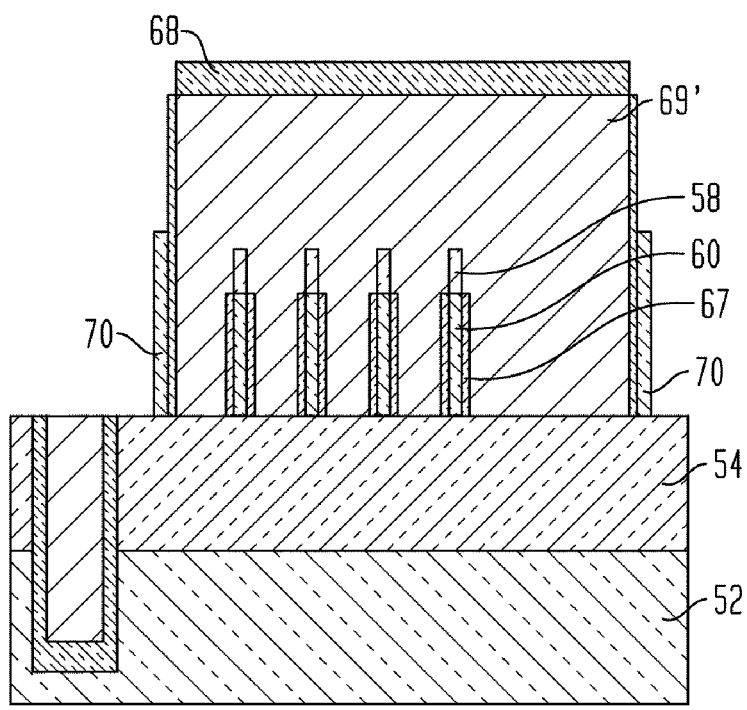
Figure 10C:
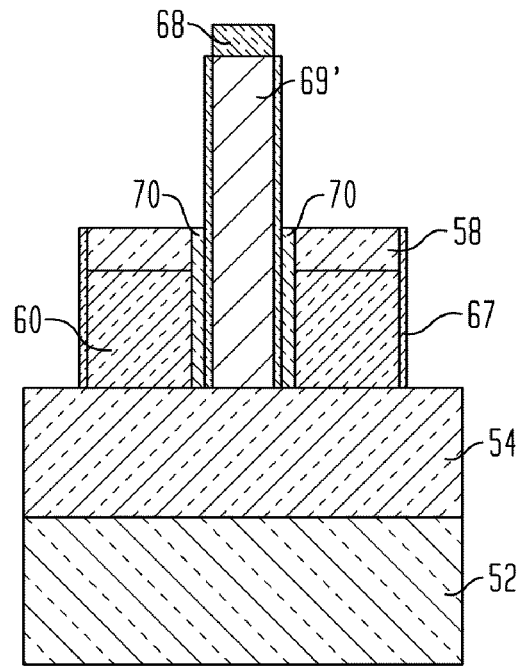

FIGS. 10A-10C shows the structure after partial growth of an epitaxial semiconductor layer 72. The partial growth is performed utilizing a selective epitaxial growth process. It is noted that at this point of the present invention the FINs are not merged. This is evidence by the space that is still shown to be present between each of the parallel oriented FINs 60. The epitaxially grown semiconductor material typically comprises a Si-containing semiconductor material such as, for example, Si or SiGe. The lateral thickness of the partially grown epitaxial semiconductor layer 72 is typically from about 20 to about 50 nm. The partially grown epitaxial semiconductor layer 72 has a thickness that is generally associated with conventional raised source/drain regions of prior art FINFET structures.

It is noted that at this point of the present application source/drain implantations may be performed to form source/drain regions (not specifically shown or labeled) within the partially grown epitaxial semiconductor layer 72.

Figure 11A:
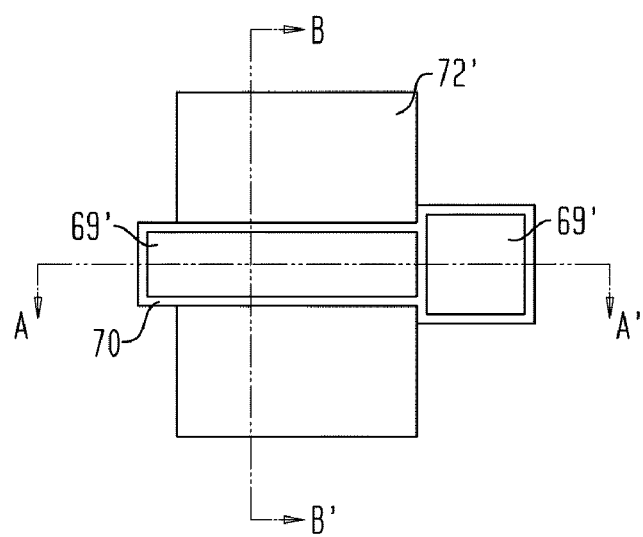
Figure 11B:
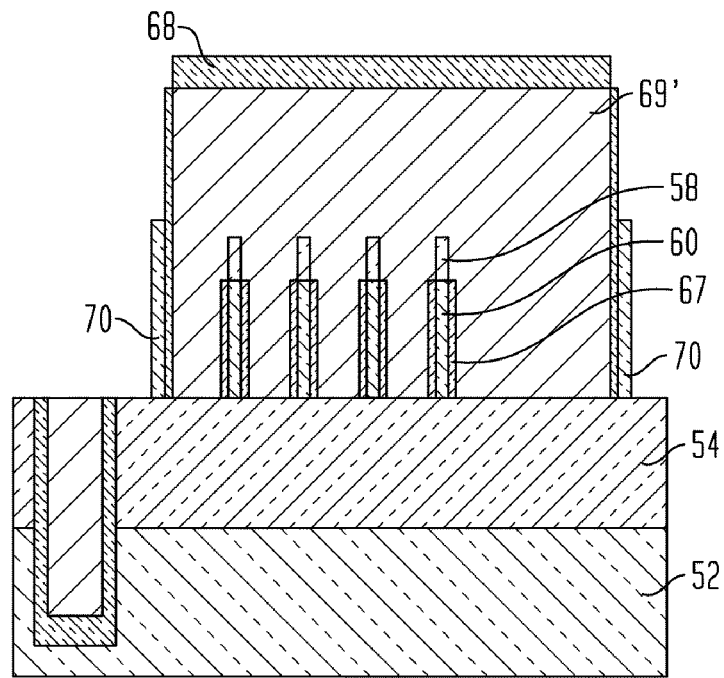
Figure 11C:
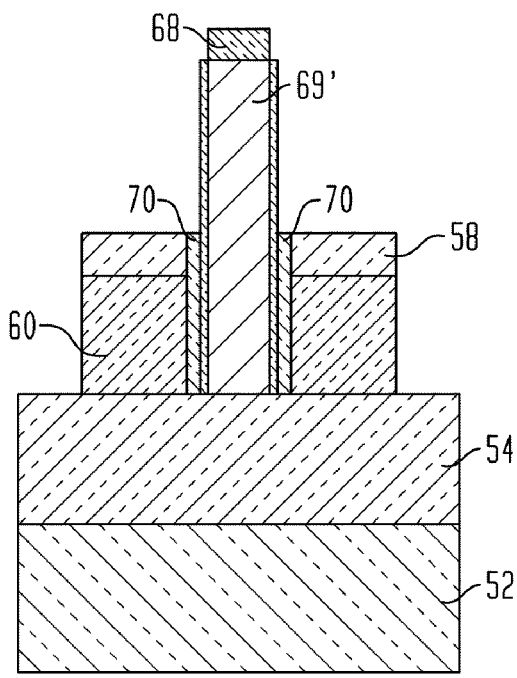

FIGS. 11A-11C show the structure after full growth of an epitaxial semiconductor layer 72'. The fully grown epitaxial semiconductor layer 72' merges each of the parallel oriented FINs 60. The lateral thickness of the fully grown epitaxial semiconductor layer 72' varies and is dependent on the number of FINs within a given structure. It is noted that the thickness of the fully grown epitaxial semiconductor layer 72' must merge (i.e., cover) each of the FINs present in the structure.

Figure 12A:
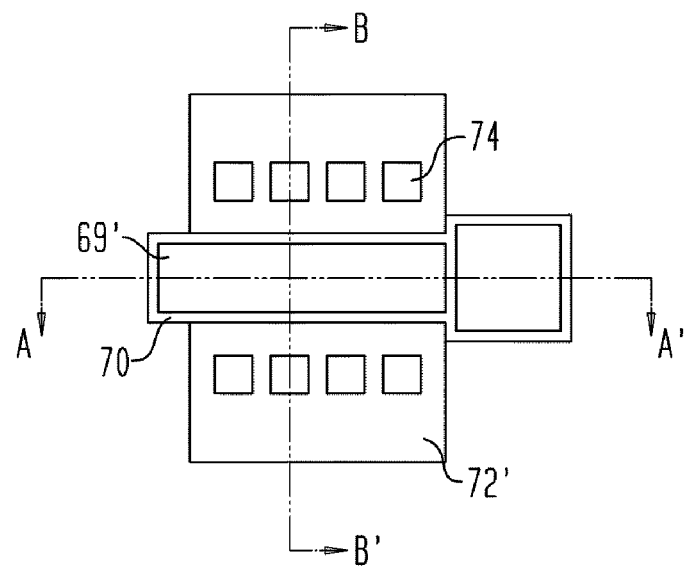
Figure 12B:
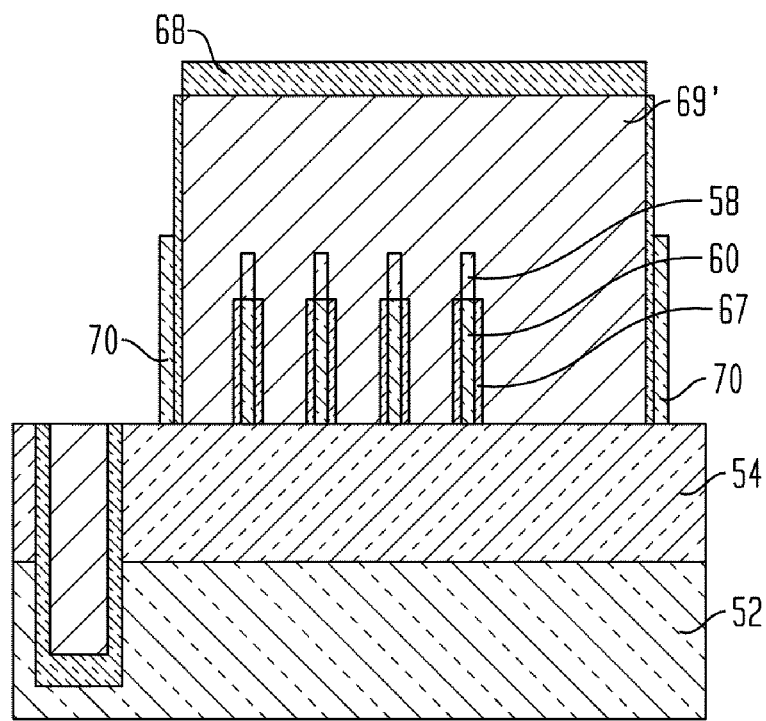
Figure 12C:
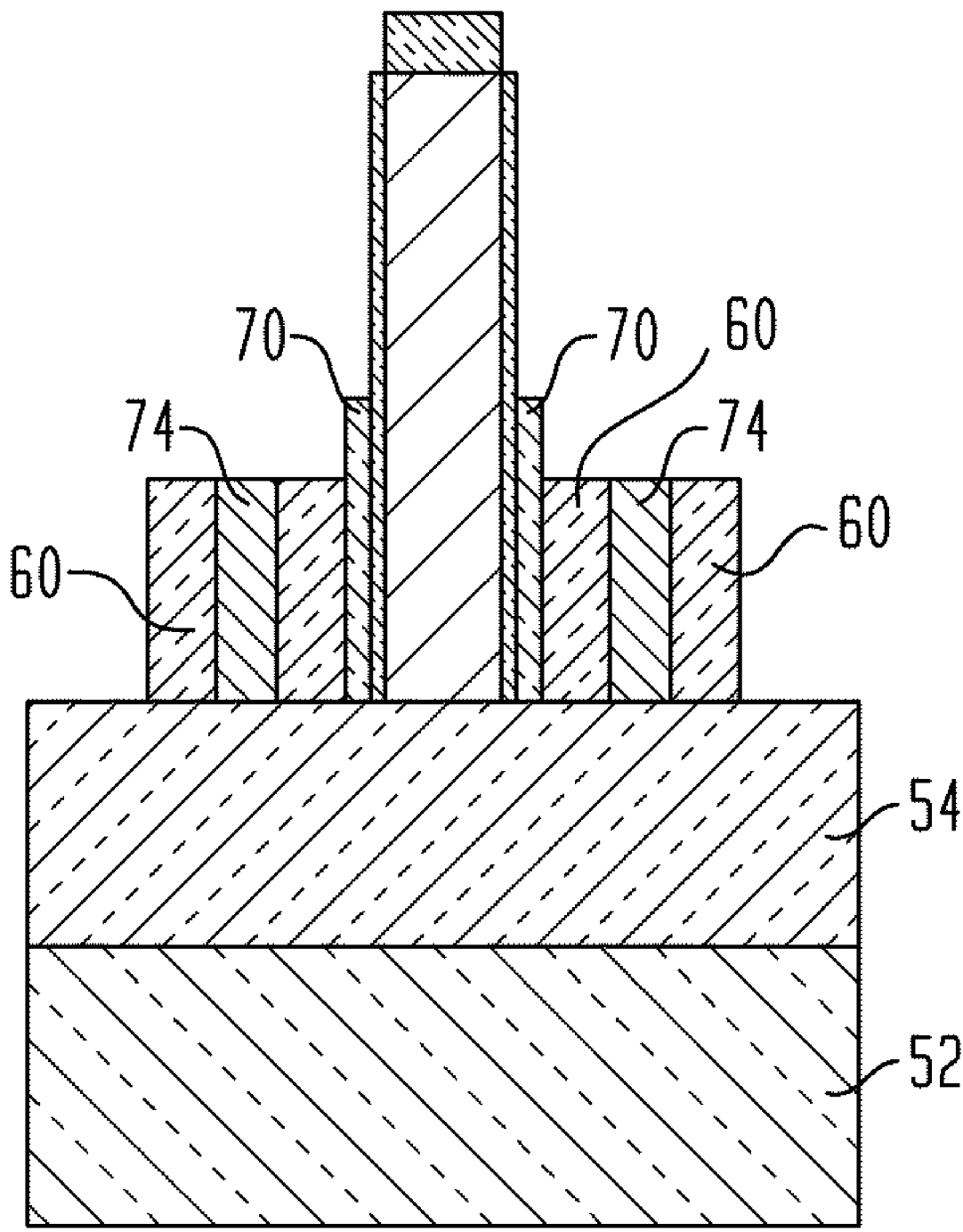

FIGS. 12A-12C shows the structure after contact 74 formation. The contacts 74 are formed utilizing standard techniques that are well known to those skilled in the art. For example, contact openings are first formed into exposed portions of the fully grown epitaxial semiconductor layer 72' utilizing lithography and etching. After etching and removal of the resist material, a contact metal such as, for example, Cu, Al, W, or AlCu is formed within the contact openings forming contacts 74.

Figure 13:
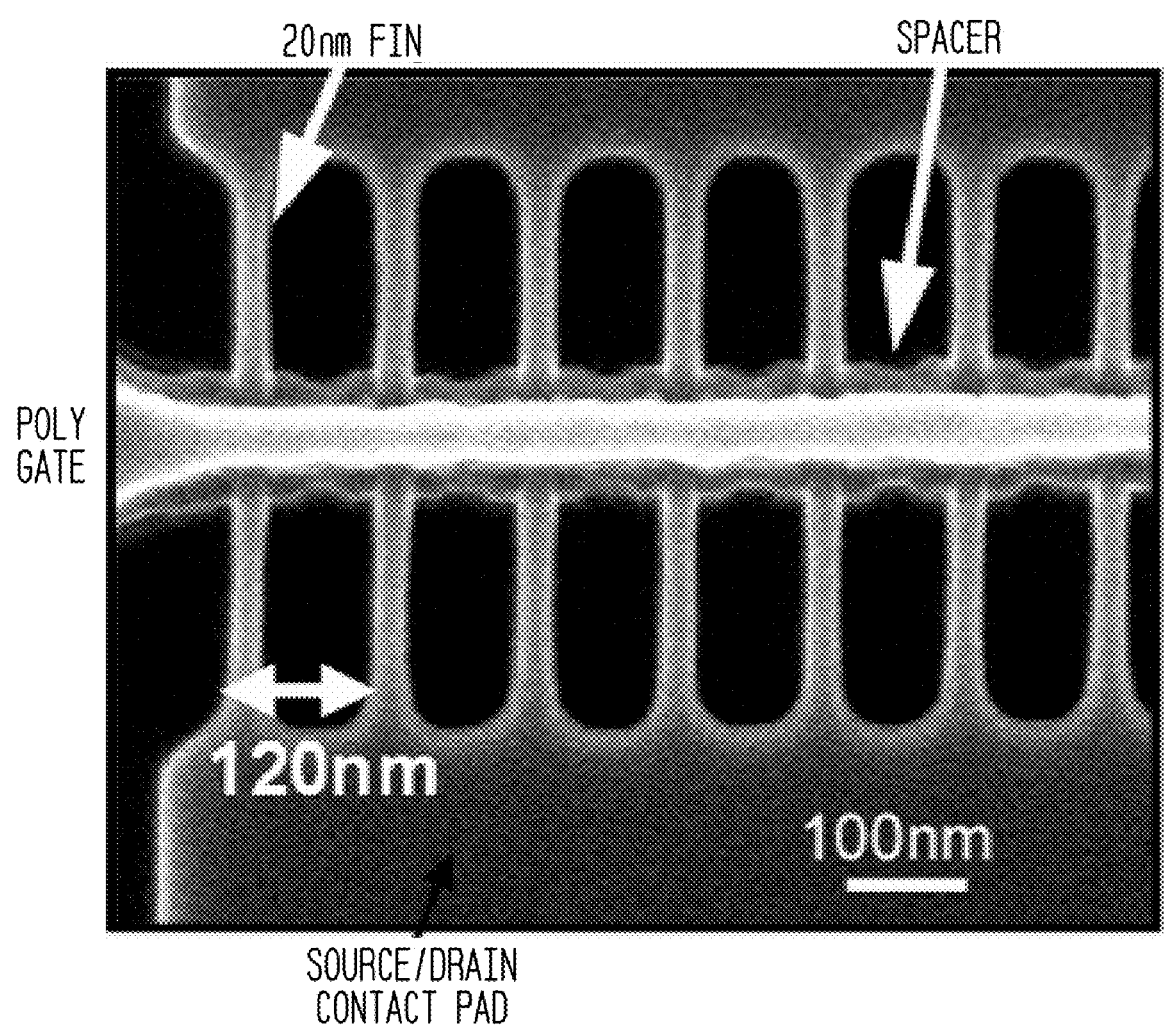
FIG. 13 is a scanning electron micrograph (SEM) of a conventional FINFET with multiple FINS at a 120 nm pitch obtained using e-beam lithography; all the FINs in the prior art structure are connected at the end using a large source/drain contact pad.

Reference is now made to the various SEMs shown in FIGS. 13-16. Specifically, FIG. 13 is a scanning electron micrograph (SEM) of a conventional FINFET with multiple FINS at a 120 nm pitch obtained using e-beam lithography. In this SEM, all of the parallel oriented FINs are connected at the end using a large source/drain contact pad.

Figure 14:
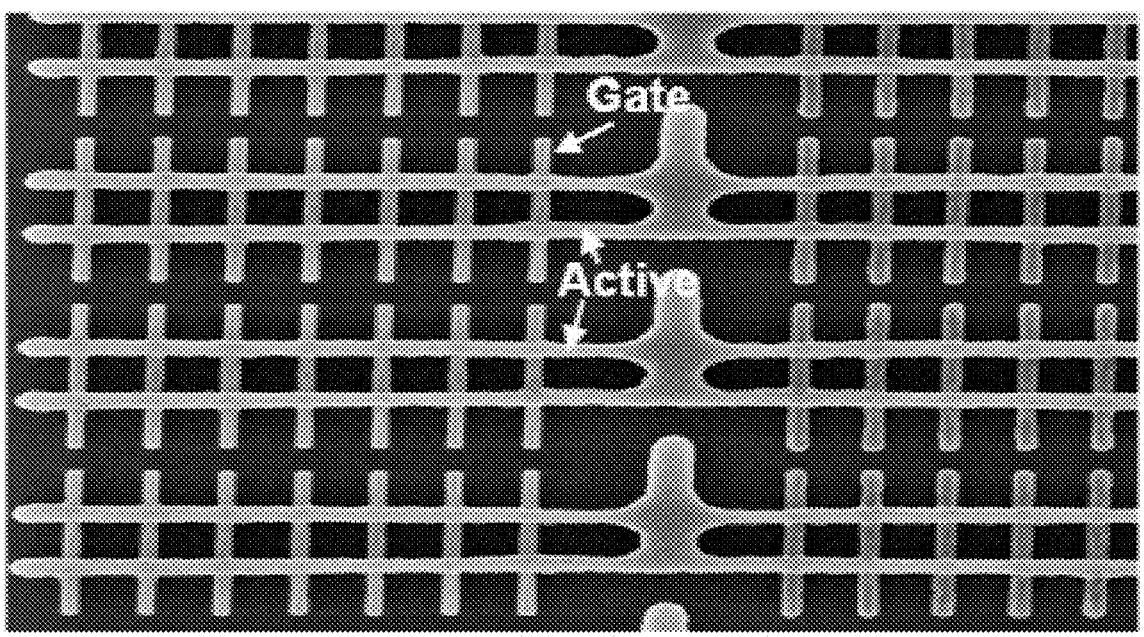
FIG. 14 is a SEM of the inventive FINFET structure where all the individual FINs are printed without source/drain contacts and prior to epitaxy.
Figure 16:
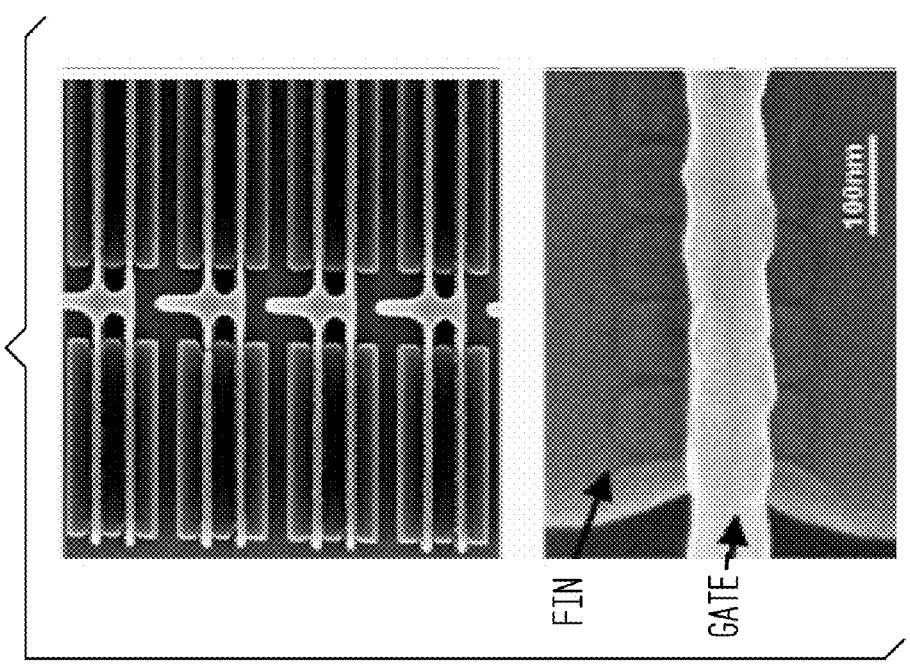
FIG. 16 is a SEM of a FINFET structure of FIG. 14 after merging the individual FINs together using a 50 nm selective epi Si.
Figure 15:
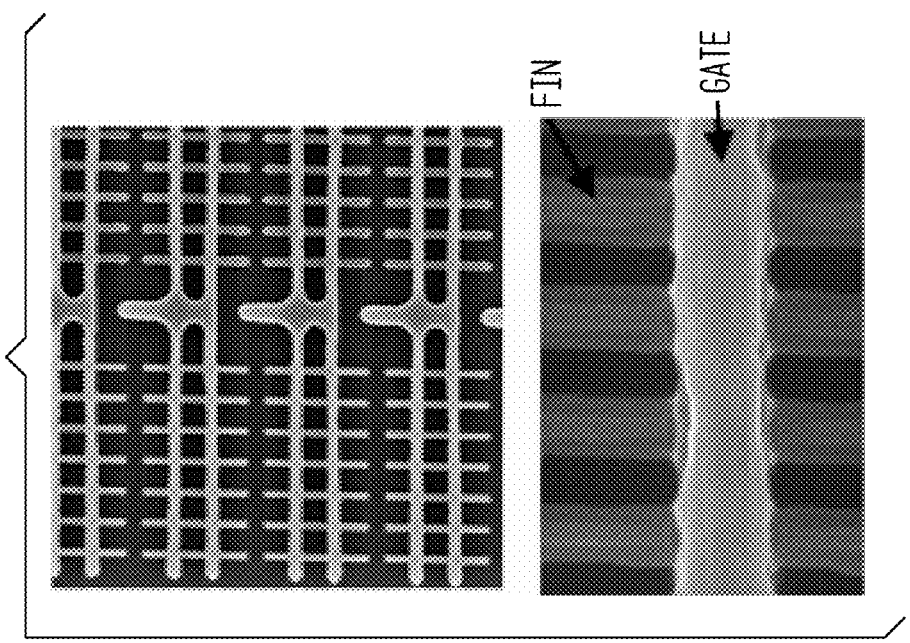
FIG. 15 is a SEM of a FINFET structure of FIG. 14 after selective raised source/drain formation of a 25 nm epi Si.

FIG. 14 is a SEM of the inventive FINFET structure where all the individual parallel oriented FINs are printed without source/drain contacts and prior to epitaxy. FIG. 15 is a SEM of the FINFET structure of FIG. 14 after selective raised source/drain formation of a 25 nm epi Si (i.e., formation of the partially epitaxial semiconductor layer). FIG. 16 is a SEM of a FINFET structure of FIG. 14 after merging the individual parallel oriented FINs together using a 50 nm selective epi Si layer (i.e., fully grown epitaxially semiconductor layer). In accordance with the present invention, the merging of the FINs reduces the series resistance. It is noted that after the FINs have been merged, the FINFET devices look exactly the same planar FETs, thus the standard middle of the liner processing can be applied to the FINFET devices of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a plurality of parallel oriented semiconducting bodies which extend above a surface of a substrate;
   a common patterned gate electrode surrounding said plurality of parallel oriented semiconducting bodies;
   an insulating layer located on exposed sidewall surfaces and on a top surface of the common patterned gate electrode;
   a nitride-containing spacer located only on a lower portion of said insulating layer that is located on said sidewall surfaces of said common patterned gate electrode in a region in which said common patterned gate electrode intercrosses with at least one of said parallel oriented semiconducting bodies; and
   an epitaxial semiconductor layer located atop and between each of said parallel oriented semiconductor bodies, said epitaxial semiconductor layer merges each of said parallel oriented semiconducting bodies together.

2. The semiconductor structure of claim 1 wherein said substrate includes a buried insulating layer and an underlying semiconductor layer.

3. The semiconductor structure of claim 1 wherein each of said plurality of parallel oriented semiconducting bodies comprises a Si-containing semiconductor material.

4. The semiconductor structure of claim 1 wherein a gate dielectric is located on sidewalls of each semiconducting body.

5. The semiconductor structure of claim 1 wherein a gate dielectric is located on sidewalls of, and atop each, semiconducting body.

6. The semiconductor structure of claim 1 wherein said epitaxial semiconductor layer comprises a Si-containing material.

7. The semiconductor structure of claim 1 further comprising contacts located within said epitaxial semiconductor layer.

8. The semiconductor structure of claim 7 wherein said contacts comprise a contact metal located in a contact opening.

9. The semiconductor structure of claim 8 wherein said contact metal comprises Cu, Al, W, or AlCu.

10. The semiconductor structure of claim 1 further comprising a trench isolation region located within said substrate.

11. The semiconductor structure of claim 1 wherein said epitaxial semiconductor layer has a lateral thickness of from about 20 nm to about 50 nm.

12. A semiconductor structure comprising:
a plurality of parallel oriented semiconducting bodies which extend above a surface of a substrate;
a common patterned gate electrode surrounding said plurality of parallel oriented semiconducting bodies;
an insulating layer located on exposed sidewall surfaces and a top surface of said common patterned gate electrode;
a nitride-containing spacer located only on a lower portion of said insulating layer that is adjacent said sidewall surfaces of said common patterned gate electrode in a region in which said common patterned gate electrode intercrosses with at least one of said parallel oriented semiconducting bodies, wherein one edge of said nitride-containing spacer laterally abuts a portion of said insulating layer and wherein an upper portion of said insulating layer is exposed; and
an epitaxial semiconductor layer located atop and between each of said parallel oriented semiconductor bodies, said epitaxial semiconductor layer merges each of said parallel oriented semiconducting bodies together.

13. The semiconductor structure of claim 12 wherein said substrate includes a buried insulating layer and an underlying semiconductor layer.

14. The semiconductor structure of claim 12 wherein each of said plurality of parallel oriented semiconducting bodies comprises a Si-containing semiconductor material.

15. The semiconductor structure of claim 12 wherein a gate dielectric is located at least on sidewalls of each semiconducting body.

16. The semiconductor structure of claim 12 wherein said epitaxial semiconductor layer comprises a Si-containing material.

17. The semiconductor structure of claim 12 further comprising contacts located within said epitaxial semiconductor layer.

18. The semiconductor structure of claim 17 wherein said contacts comprise a contact metal located in a contact opening, and said contact metal comprises Cu, Al, W, or AlCu.

* * * * *